United States Patent [19]

Bielska-Lewandowska et al.

[11] 4,298,990
[45] Nov. 3, 1981

[54] FREQUENCY CONVERTER OF ELECTROMAGNETIC RADIATION IN MILLIMETER AND SUBMILLIMETER WAVELENGTH RANGE

[75] Inventors: Halina Bielska-Lewandowska, Warsaw, Poland; Natalija Irisova, Moscow, U.S.S.R.; Grzegorz Jung; Stanislaw J. Lewandowski, both of Warsaw, Poland; Aleksandr Prohorov, Moscow, U.S.S.R.; Roman Sobolewski, Warsaw, Poland; Eugenij Vinogradov, Moscow, U.S.S.R.

[73] Assignee: Polska Akademia Nauk Instytut Fizyki, Warsaw, Poland

[21] Appl. No.: 95,879

[22] Filed: Nov. 19, 1979

[30] Foreign Application Priority Data

Nov. 4, 1978 [PL] Poland .................................. 210702

[51] Int. Cl.³ .......................... H04B 1/26; H02M 5/00
[52] U.S. Cl. ...................................... 455/325; 307/306; 333/219; 357/5; 363/157; 455/333
[58] Field of Search .............. 455/323, 325, 326, 327, 455/328, 330, 333; 333/218, 219, 227–233, 235, 248; 363/157, 159; 331/107 S; 329/160, 161, 203; 307/306; 357/5

[56] References Cited

U.S. PATENT DOCUMENTS

| | | | |
|---|---|---|---|
| 3,573,661 | 4/1971 | McCumber | 331/107 S |
| 3,671,848 | 6/1972 | Shapiro et al. | 333/218 |
| 3,676,808 | 7/1972 | Vinogradov et al. | 333/227 |
| 3,723,755 | 3/1973 | Morse | 331/107 S |
| 3,970,965 | 7/1976 | Shapiro et al. | 455/325 |

OTHER PUBLICATIONS

"Cryogenics Cuts Noise in 300 GHZ Receiver"-Electronics-Mar. 31, 1977, vol. 50, No. 7, p. 35.
"Josephson Junction Millimeter Microwave Source and Homodyne Detector"-Ulrich et al., Proc. of IEEE, vol. 61, No. 1, Jan. 1973, pp. 51-54.

*Primary Examiner*—Marc E. Bookbinder
*Attorney, Agent, or Firm*—Ladas & Parry

[57] ABSTRACT

A frequency converter for electromagnetic waves of the millimetric and submillimetric band comprising an open resonator whose reflectors are of diameter larger than the dimensions of the cross-section of radiation beam, said reflectors or at least one of them being an arrangement of metallic conductors and to said conductors being connected one or more Josephson junctions. Said conductors are equipped with external contacts situated on the circumference of the converter and used to interconnect the Josephson junctions.

The converter finds applications as a detector of electromagnetic waves of the millimetric and submillimetric band and/or as a mixer of waves of different wavelength.

4 Claims, 3 Drawing Figures

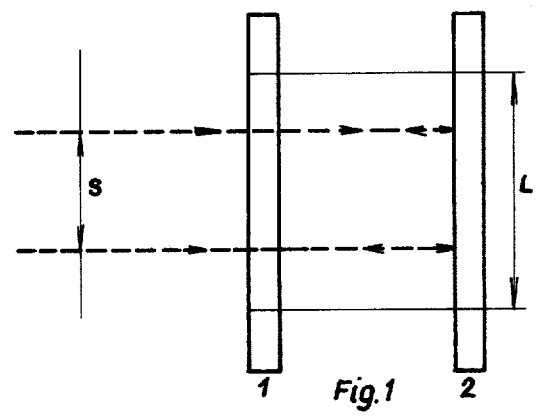
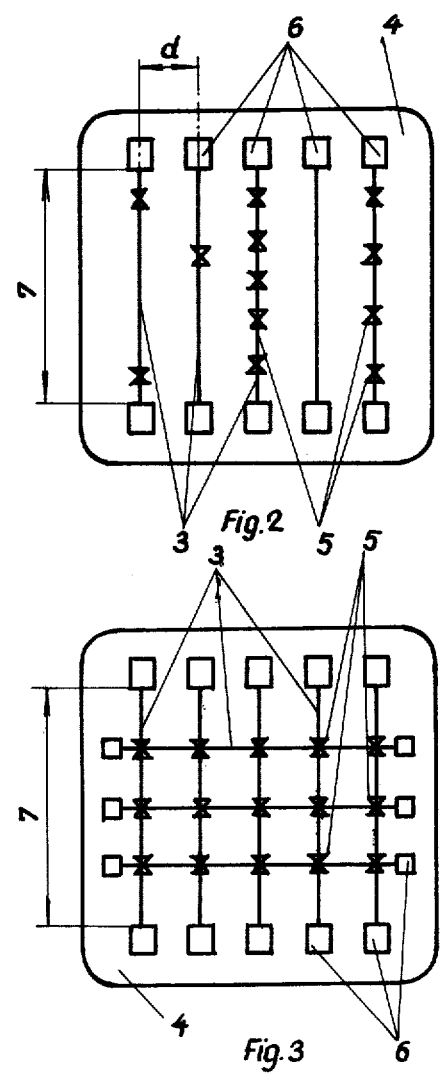
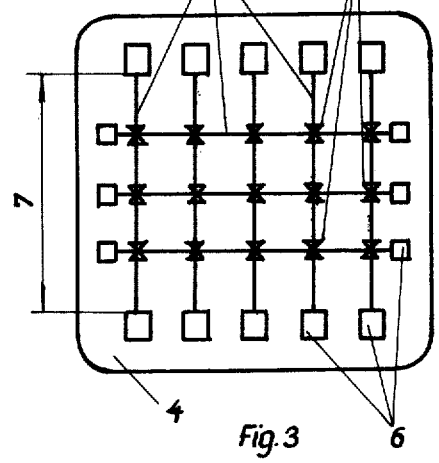

FREQUENCY CONVERTER OF ELECTROMAGNETIC RADIATION IN MILLIMETER AND SUBMILLIMETER WAVELENGTH RANGE

The object of the invention is a frequency converter utilizing Josephson junctions for applications both as a single frequency detector or as a frequency mixer for radiation at different wavelengths.

In many branches of contemporary physics and engineering there is a need to convert the frequency of electromagnetic radiation of millimeter and submillimeter range. This radiation usually propagates in the form of a beam in free space or in a fiber type transmission line or in a multimode (oversized) waveguide. In all these cases the transverse dimensions S of the radiation beam are much larger then the wavelength λ.

There exist known microwave frequency converters whose operation is based on the application of a superconducting Josephson junction. For example, U.S. Pat. No. 3,671,848 discloses such a frequency converter wherein the superconducting Josephson junction is positioned within a resonant cavity and is biased by a voltage across the junction.

In addition, other frequency converters which employ Josephson junctions are known from U.S. Pat. Nos. 3,970,965 and 3,723,755. It is moreover known in the art of microwave frequency conversion to utilize a single Josephson junction in the form of a point contact. These converters exhibit several disadvantages that make their application for the conversion of the radiation at $S>\lambda$ difficult, namely: small effective area of mutual interaction between the radiation and the Josephson junction—the junction area is of the order of 0.01 mm$^2$ while the cross-section of the radiation beam is of the order of 10 mm$^2$. Moreover, a single Josephson junction as an element of a microwave circuit has a very small wave impedance of the order of $10^{-4}$ ohm, and because of that it cannot be matched by any known method and thus only a small part of the incident radiation is converted to the useful signal.

Voltage arising on a single Josephson junction due to the interaction with the beam, is small because of the small junction resistance. Its maximum value is of the order of 100 μV and that significantly hinders the elimination of interference in the recording of the useful signal.

The converter which is the object of the present invention is free of the above mentioned disadvantages.

According to the present invention the converter is made in the form of an open resonator similar to known Fabry-Perot interferometers. This resonator basically comprises two reflectors whose reflecting surfaces have overall dimensions larger than the geometrical dimensions of the cross-section of the radiation beam. At least one of these reflectors being the basic active element of the converter, is formed by a grid of equally spaced metallic conductors whose spacing is smaller than the wavelength. In these conductors or only in some parts thereof are incorporated Josephson junctions and the conductors form simultaneously the connections of the junctions to the external contacts. In order to provide resonator tuning to the resonance at least one reflector is mounted in such a manner that it can be moved with respect to the other one. The use of a grid of parallel conductors as the reflector in a Fabry-Perot interferometer is known and described for instance in U.S. Pat. No. 3,676,808. The grid interacts with the incident beam in such a way that the major part of the radiation with electric field vector $\vec{E}$ perpendicular to the conductors will be transmitted through the grid and the major part of the radiation with vector $\vec{E}$ parallel to the conductors will be reflected.

All of the elements of the grid, including the Josephson junctions incorporated therein according to the invention, take part simultaneously in the processing of both the transmitted and incident radiation.

The converter according to the present invention exhibits high conversion efficiency and the possibility of arbitrary interconnection of the junctions provides its universality.

The invention can be easily understood from the following detailed description of its embodiment taken in conjunction with the accompanying drawings.

FIG. 1 is a side view of a frequency converter comprising an open resonator having two reflectors and showing an electromagnetic beam incident thereon;

FIG. 2 illustrates a front view of a first embodiment of the reflectors depicted in FIG. 1; and FIG. 3 illustrates a front view of a second embodiment of the reflectors depicted in FIG. 1.

As seen in FIG. 1, the frequency converter is in the form of a Fabry-Perot interferometer with two flat reflectors 1,2. The overall dimension L of the reflecting surface of each reflector is larger than the cross-section S of the incident electromagnetic beam.

Illustratively, reflectors 1 and 2 are each formed of a periodic arrangement of metallic conductors 3 mounted on a flat dielectric surface 4, the period d of each arrangement being less than the wavelength of the radiation. These conductors include Josephson junctions 5, and simultaneously form the connections of the junctions to external contacts 6. Contacts 6 are situated on the same dielectric surface as the reflector, but are located on the periphery of the electrically active reflecting surface, so that they do not interfere with the processing of the incident electromagnetic radiation. External wiring to contacts 6 enables arbitrary connection (i.e. both series and parallel) of the Josephson junctions incorporated in each metallic conductor.

In order to provide resonator tuning, at least one reflector may be movably mounted with respect to the other reflector.

Each reflector can be also manufactured in the form of a two-dimensional grid, as shown in FIG. 3. That arrangement enables the series-parallel connection of the Josephson junctions. The Josephson junctions can be made as a constriction in a grid element (a so-called superconducting bridge) or can be of a tunneling type. As to the latter, the active element of the resonator, i.e. the grid reflector which incorporates the tunnel type Josephson junctions, can be made in the following way: evaporate the conductors on a dielectric substrate in two or more sections separated by one or more gaps; then cover the conductors by a thin oxide layer; and finally fill the gaps by evaporated metallic conducting sections. A reflector with a two-dimensional grid may be made as follows: evaporate a second structure of conductors upon and at right angles to a planar first structure of evaporated and superficially oxidized conductors. In this case, each conductor from the upper layer is connected to the lower layer by a large number of the tunnel junctions.

The impedance match between the input impedance of the Josephson junctions incorporated in the converter and the impedance of free space or of the transmission line which guides the radiation is obtained by multiple reflections of radiation between the resonator reflectors when the resonator is adjusted to the resonance at the frequency of the incident radiation, i.e. when the distance between the reflectors is equal to the multiple number of half wavelengths.

To achieve the tuning of the resonator to the resonance at least one of the reflectors is mounted on a slide which enables the displacement of this reflector in the direction perpendicular to its plane.

The converter can operate both as a single frequency receiver and as a frequency mixer. In the case when the converter is used as a mixer, the interacting radiation signals can be coupled to the resonator in several ways—via a single grid reflector or via the two opposite reflectors. To obtain the best conversion coefficient the resonator must be tuned to the resonance at both incident frequencies i.e. the resonator length must be equal to an integral multiple of half wavelengths of both radiations. If the frequencies of both signals do not differ much from each other, it means that both these frequencies should lie within the halfwidth of the resonator resonance curve. If the difference between the frequencies of the incident signals is greater, these frequencies must coincide with corresponding resonator modes. The latter situation can be especially easily achieved for frequency multipliers, where it is sufficient to tune the resonator to the resonance at the multiplied lower frequency.

What is claimed is:

1. A microwave frequency converter for receiving an electromagnetic radiation beam propagating in a direction to be incident on said converter, said beam being of a given cross-sectional size and microwave frequency, said converter comprising an open resonator having at least two spaced reflectors lying one behind the other in substantially parallel planes substantially normal to said direction, whereby an axis through centers of said reflectors is substantially aligned with an axis through a center of said beam, said reflectors being of a size larger than said given cross-sectional size, at least one of said reflectors comprising a plurality of parallel metallic conductors mounted on a flat dielectric surface and equidistantly spaced from one another by a distance less than the wavelength of said given microwave frequency, each conductor incorporating at least one Josephson junction.

2. A converter according to claim 1, wherein said metallic conductors are provided with contacts at the periphery of the reflector for enabling external series and parallel connections of the Josephson junctions to be made.

3. A converter according to claim 1, wherein at least one reflector of said open resonator is displaceable in a direction normal to the plane in which it lies.

4. A converter according to claim 1, wherein at least two of the Josephson junctions are arranged to operate in a collective, i.e. coherent, mode.

* * * * *